United States Patent [19]

Shank

[11] Patent Number: 5,438,531
[45] Date of Patent: Aug. 1, 1995

[54] ZERO DEAD TIME ACQUISITION FOR A DIGITAL STORAGE OSCILLOSCOPE

[75] Inventor: Gordon W. Shank, Portland, Oreg.

[73] Assignee: Tektronix, Inc., Wilsonville, Oreg.

[21] Appl. No.: 85,368

[22] Filed: Jul. 2, 1993

[51] Int. Cl.⁶ .............................................. G06F 15/31
[52] U.S. Cl. ................................................... 364/724.1
[58] Field of Search ........... 364/724.1, 724.17, 724.01, 364/724.19, 715.06; 340/146.2

[56] References Cited

U.S. PATENT DOCUMENTS 4,326,261 4/1982 Peoples ............................... 364/724

*Primary Examiner*—Tan V. Mai
*Attorney, Agent, or Firm*—Francis I. Gray; Boulden G. Griffith

[57] ABSTRACT

A zero dead time acquisition system for a digital storage oscilloscope (DSO) has an input buffer that stores an initial value from an acquisition memory for each sample interval of an input analog signal. The input analog signal is oversampled and digitized so that there are multiple digitized samples of the analog signal for each sample interval. At the beginning of a sample interval the initial value from the input buffer is transferred to an accumulation register, the output of which is compared with the multiple samples of the analog signal during the sample interval. If any of the multiple samples falls outside the limit determined by the value in the accumulation register, in a save on delta mode a latch is set to generate an error signal that terminates further acquisition cycles. In an envelope mode the comparison result causes the value in the accumulation register to be replaced with the sample value that fell outside the limit to establish a new limit, either maximum or minimum. At the end of the sample interval the value in the accumulation register is transferred to the acquisition memory while a new initial value is transferred to the accumulation register. In this manner both envelope and save on delta modes are implemented directly in the acquisition memory without requiring digital processing time so that the hold-off time after the acquisition cycle may be reduced to zero, producing "zero dead time."

11 Claims, 3 Drawing Sheets

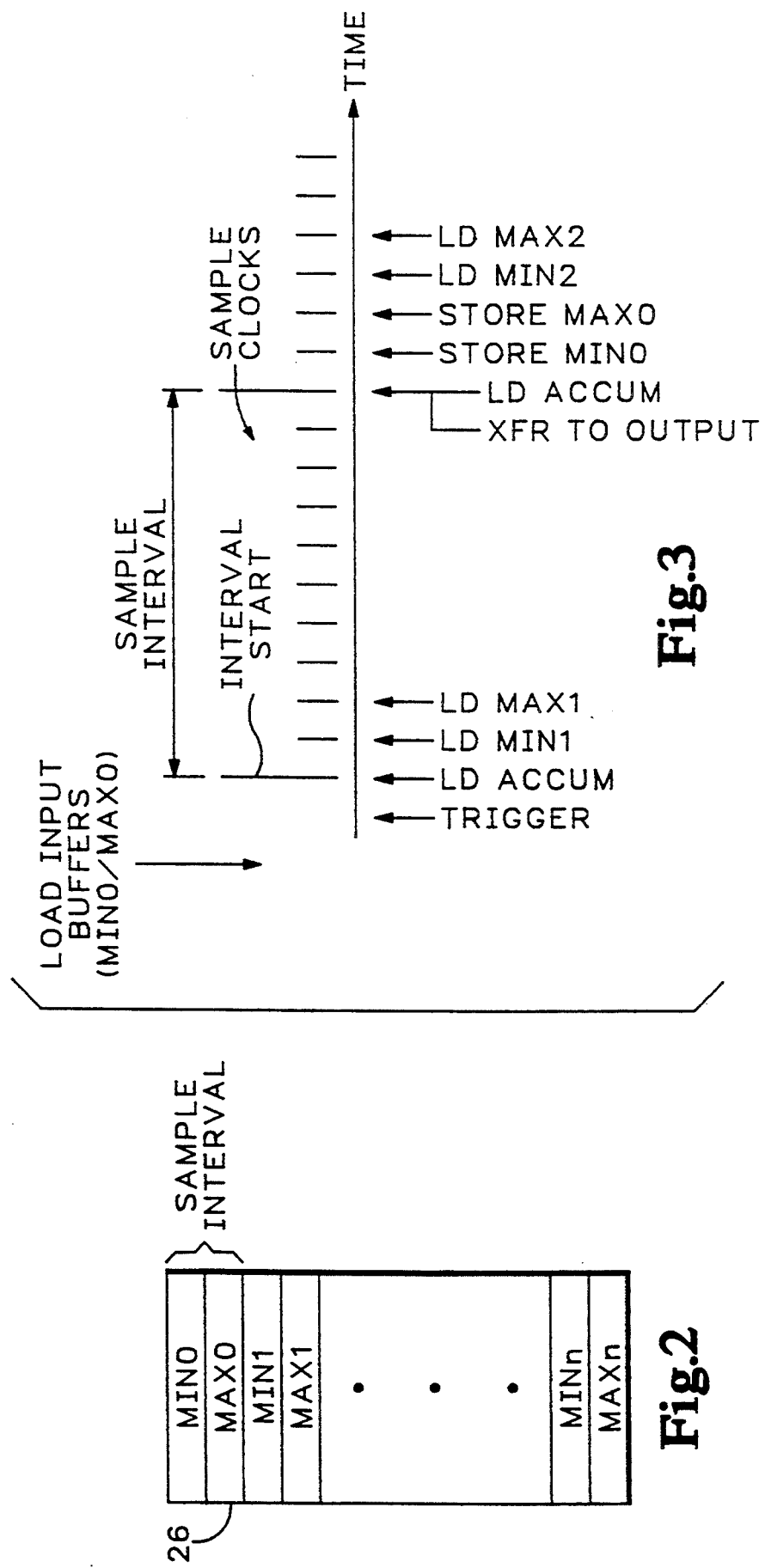

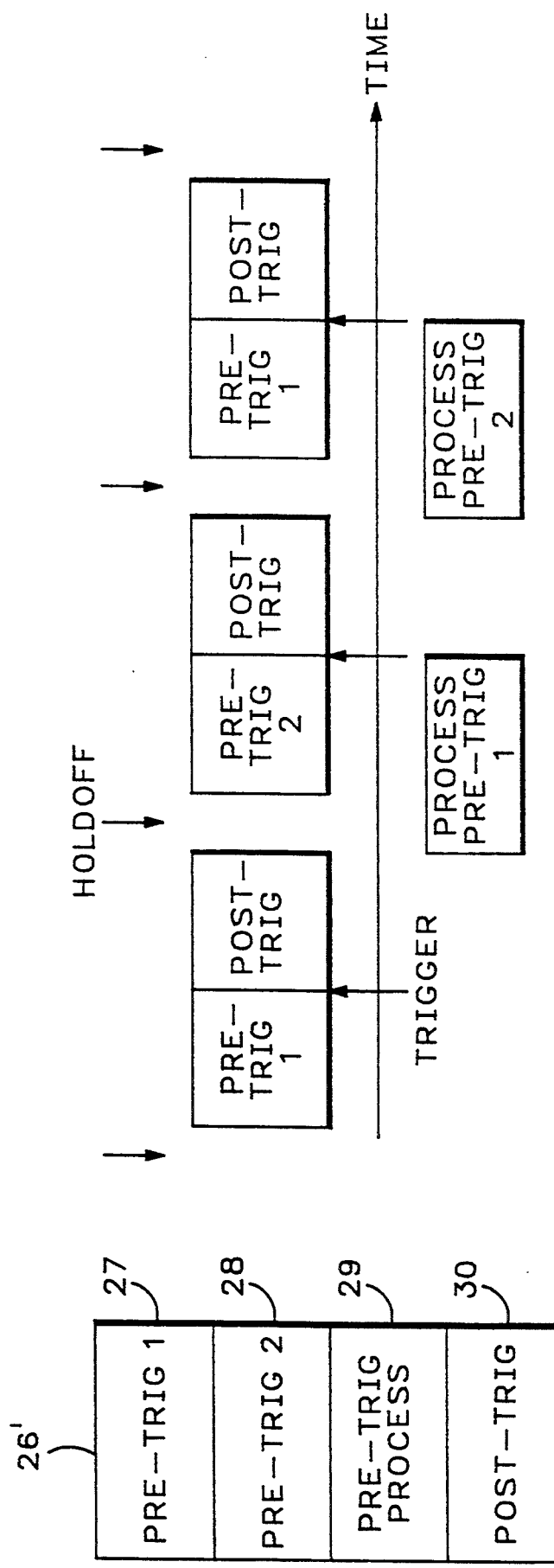

ZERO DEAD TIME ACQUISITION FOR A DIGITAL STORAGE OSCILLOSCOPE

BACKGROUND OF THE INVENTION

The present invention relates to acquisition of electrical signals, and more particularly to zero dead time acquisition for a digital storage oscilloscope (DSO) that allows a conventional flash conversion DSO to perform tasks normally only available in analog oscilloscopes.

An analog oscilloscope displays an analog signal in real time as a function of amplitude versus time. The display of the analog signal starts when a trigger signal is generated in response to a trigger event, such as the zero crossing of the analog signal. The trigger signal is used to start the trace of an electron beam from one edge of a display area across the faceplate of a cathode ray tube (CRT). The analog signal is used to modulate the trace in an orthogonal direction to produce the familiar amplitude versus time display. If a portion of the analog signal before the trigger signal is desired to be displayed, the analog signal may be delayed. When the trace reaches the opposite edge of the display area, a hold-off time is used to shut off the beam during the electron beam retrace time. The time that the electron beam takes to sweep across the display area is the display time. The next sweep of the oscilloscope occurs on the next trigger signal after the hold-off time to start the next display time.

A digital storage oscilloscope (DSO) does not display the analog signal in real time. Rather the DSO samples and digitizes the analog signal at a predetermined sample rate to produce a stream of digital data samples that represent the analog signal. The digital data samples are processed and eventually stored in a main memory, from which they may be read out for display to reproduce the analog signal. There are two modes of acquiring a digital representation of the analog signal—a post-trigger mode and a pre-trigger mode. The post-trigger mode is equivalent to the analog counterpart in that no data samples are acquired until the trigger event generates the trigger signal. After the trigger event occurs the analog signal is sampled and digitized and the resulting digital data samples are stored in sequential locations of an acquisition memory, ignoring for the purpose of this discussion equivalent and random time sampling techniques used for very high frequency repetitive signals, until the acquisition memory is "full". One way to provide greater accuracy for the data that is displayed in the DSO is to oversample the analog signal so that, if the acquisition memory has 500 locations, 4000 samples of the analog signal may be obtained and decimated into 500 samples for storage, as an example. Each location in the acquisition memory represents a sample interval, with eight subsamples for the present example. The subsamples are processed in real time to obtain a single value for the sample interval or, in the case of an envelope mode, a minimum and a maximum value for the sample interval. Due to the length of time that it requires to digitally process the data in the acquisition memory before it is transferred into the main memory, such as determining minimum and maximum values between a prior acquisition cycle stored in the main memory and the just acquired data samples from the acquisition memory, the digital processing time may be considerably longer than the analog hold-off time.

If a spurious impulse occurs sporadically in the analog signal, conventional wisdom is that it is more likely to be observed by the analog oscilloscope, especially if it is of the micro-channel plate (MCP) type, than by a DSO. Two factors enter into this—the shorter hold-off time for analog oscilloscopes and the time between data samples of the digital oscilloscope. The period of time during which the analog signal is not displayed (analog oscilloscope) or acquired (DSO) is termed "dead time." In a digital storage oscilloscope (DSO), for example, normal MIN/MAX decimation systems start with a MIN of "ff" and a MAX of "00" (8-bit system) for a sample interval of interest. All subsamples within the sample interval are compared with the stored MIN/MAX values, and replace the stored values if necessary as indicated by the comparison. The final MIN/MAX pair for the interval is then stored in an acquisition memory, the location corresponding to the sample interval. When an acquisition cycle is complete, the contents of the acquisition memory and a previous copy in a main memory are MIN/MAX'd together by a processor, with the results being replaced in the main memory. The time it takes for the processor to perform this operation between the main and acquisition memories is considerable when compared to the hold-off time of an analog oscilloscope, which contributes to dead time. Even if a redundant acquisition memory is provided, the processing time still takes too long so that the redundant acquisition memory is filled before the processing is completed. The dead time is merely reduced, but not eliminated.

DSOs also have the ability to display data prior to the trigger signal in a pre-trigger mode, which has the capability of providing much more of the analog signal for display that occurs before the trigger signal than does the analog signal delay of the analog oscilloscope. In fact in the extreme the only data displayed may be all pre-trigger data. The pre-trigger time needs to expire before the trigger signal causes the DSO to start the next acquisition cycle.

What is desired is a means for implementing a "zero dead time" acquisition mode that performs decimation and accumulation at acquisition time while eliminating the necessity of having a hold-off time due to digital signal processing.

SUMMARY OF THE INVENTION

Accordingly the present invention provides zero dead time acquisition for a digital storage oscilloscope (DSO) by performing accumulation in an acquisition memory so that there is no processor intervention to accumulate or otherwise process signal values between acquisition cycles. Input buffers and output buffers are added to the acquisition system of conventional DSOs. Accumulators are seeded from the acquisition memory at the beginning of each sample interval, and are compared with an incoming stream of digitized data samples within the sample interval. If necessary, the values in the accumulators are changed on each sample clock within the sample interval. For envelope mode the values in the accumulators represent minimum and maximum values for the sample interval. For save-on-delta mode the values in the accumulators are waveform specification, or template, values. The outputs from the comparators trigger a latch in the save-on-delta mode when the incoming digitized data samples fall outside the template values.

The objects, advantages and other novel features of the present invention are apparent from the following

BRIEF DESCRIPTION OF THE DRAWING

FIG. 2 is a diagrammatic representation view of a post-trigger acquisition memory.

FIG. 3 is a timing diagram view for zero dead time acquisition of post-trigger data samples according to the present invention.

FIG. 4 is a diagrammatic representation view of a pre-trigger acquisition memory according to the present invention.

FIG. 5 is a block timing diagram view for zero dead time acquisition when pre-trigger data samples are acquired according to the present invention.

DESCRIPTION OF THE PREFERRED EMBODIMENT

Figure 1:
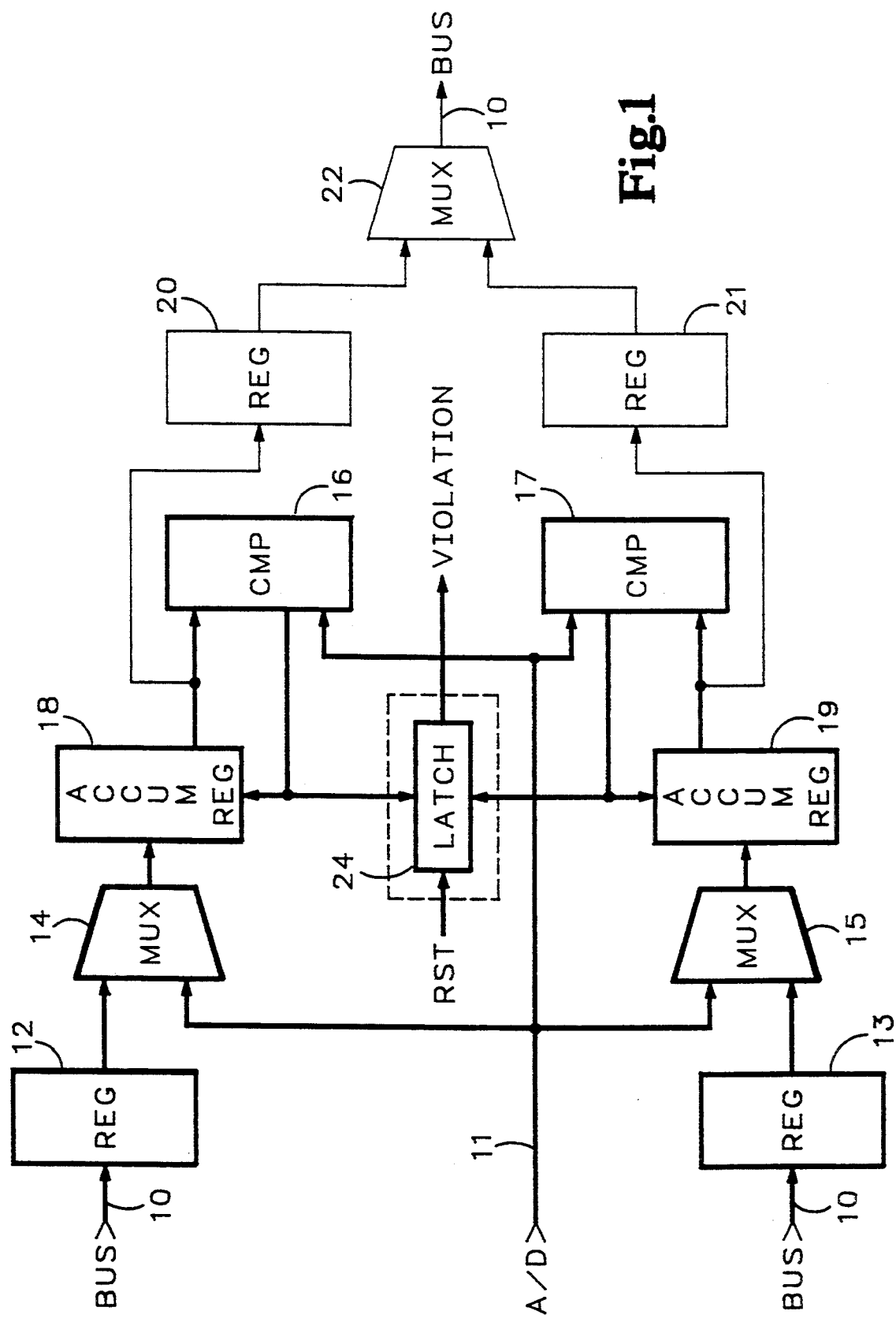
FIG. 1 is a block diagram view of a zero dead time acquisition system according to the present invention.

Referring now to FIG. 1 a first input buffer 12 and a second input buffer 13 are shown coupled to receive data from a data bus 10, which in turn is coupled to an acquisition memory and/or to a waveform specification memory. A stream of digitized data samples on line 11, representing an electrical signal, is input to a pair of input multiplexers 14, 15 and to a pair of comparators 16, 17. The other inputs to the pair of multiplexers 14, 15 are the outputs from the input buffers 12, 13, respectively. The outputs from the multiplexers 14, 15 are input to respective accumulators 18, 19 together with the outputs from the comparators 16, 17. The outputs from the comparators 16, 17 provide write enable signals to the accumulators 18, 19. The outputs from the accumulators 18, 19 are coupled as second inputs to the comparators 16, 17. The outputs from the accumulators 18, 19 also are coupled as inputs to respective output buffers 20, 21. The outputs of the output buffers 20, 21 are input to an output multiplexer 22, the output of which is coupled to the data bus 10. The outputs from the comparators 16, 17 also may be input to respective set inputs of a latch 24. The output of the latch 24 provides an error signal when in the save-on-delta mode to indicate that the electrical signal is outside design parameters, as indicated by a waveform specification, or template, stored in the waveform specification memory.

As shown in FIG. 2 an acquisition memory 26 for post-trigger acquisition in the envelope mode contains accumulated samples from the digitized data samples that occur after a trigger event. The accumulated samples represent MIN/MAX data pairs from prior acquisition cycles from the first sample interval after the trigger event (MIN/MAX0) to the end of the memory (MIN/MAXn). When acquisition of a signal is initiated by an operator in the envelope mode, the acquisition memory 26 is initialized with all MAX locations having "00" and all MIN locations having "ff". As shown in FIG. 3 before the first trigger signal, which starts the first acquisition cycle, MIN/MAX0 are loaded from the acquisition memory 26 via the data bus 10 into the respective input buffers 12, 13 and at the first sample clock after the first trigger signal, which is the beginning of a sample interval, the MIN/MAX0 values are transferred via the respective multiplexers 14, 15 to "seed" the respective accumulators 18, 19 with initial reference samples. At the next sample clock the first accumulation occurs if the values in the accumulators 18, 19 produce an output signal from the comparators 16, 17 due to the corresponding data value in the digitized data samples "exceeding" the accumulator value. Also one of the input buffers 12, 13 is loaded with the next value from the acquisition memory 26, and on the next sample clock the other input buffer 13, 12 is loaded with the following value from the acquisition memory so that the input buffers are loaded with the next min/max data pair (MIN/MAX1). For each subsequent sample clock during the sample interval the corresponding digitized data samples are compared with the reference samples from the accumulators 18, 19 by the respective comparators 16, 17. If any of the digitized data samples within the sample interval fall outside of the limits determined by the reference samples, the appropriate accumulator 18, 19 is enabled by the corresponding comparator 16, 17 output. The reference sample that is "exceeded" then is replaced in the appropriate accumulator 18, 19 via the appropriate input multiplexer 14, 15 by the digitized data sample that caused the out of limits condition. At the end of the sample interval, which is the beginning of the next sample interval, the reference samples from the accumulators 18, 19 are transferred to the output buffers 20, 21 and the next MAX/MIN samples from the acquisition memory 26, which were loaded into the input buffers 12, 13 during the previous sample interval, are loaded from the input buffers into the accumulators. For the first two sample clocks in the next sample interval the MIN and MAX values from the output buffers 20, 21 are transferred to the appropriate locations in the acquisition memory 26 via the data bus 10, replacing the former MIN/MAX values. Then the MIN/MAX values for the following sample interval are loaded into the input buffers 12, 13, as discussed above. This process continues for each sample interval of the current acquisition cycle so that at the end of the first acquisition cycle all of the "00" and "ff" values in the acquisition memory 26 have been replaced with the maximum and minimum values of the digitized analog waveform signal for each sample interval. Then hold-off is asserted, although hold-off may be essentially zero since no subsequent data processing is required. This process is repeated for each subsequent acquisition cycle until acquisition is terminated. Each subsequent acquisition cycle may begin at the next available trigger signal after the end of the preceding acquisition cycle, i.e., no hold-off which produces "zero dead time."

The post-trigger mode described above is simple because the time relationships between the data samples accumulated and the trigger signal are known. In the pre-trigger mode no relationships between data samples and the trigger signal are known while the data samples are being acquired since the trigger event has not yet occurred. Therefore it is not possible to know which data samples to accumulate in which memory locations before hand. The problem is solved by comparing the pre-trigger accumulated data samples with prior pre-trigger accumulated data samples during the acquisition of pre-trigger data samples on the next acquisition cycle. As shown in FIG. 4 the acquisition memory 26' is divided into four sections, a first pre-trigger section 27, a second pre-trigger section 28, a processed/template pre-trigger section 29 and a post-trigger section 30. The first two sections 27, 28 of the acquisition memory 26' are circulating memories for acquiring data samples during the pre-trigger sample intervals.

The sequence of operation in the envelope mode for pre-trigger is described below with respect to FIG. 5. The pre-trigger sections 27, 28 alternate, i.e., during one acquisition cycle one pre-trigger section is used and during the next acquisition cycle the other pre-trigger section is used. During the pre-trigger portion of an acquisition cycle the digitized data samples are applied via the input multiplexers 14, 15 directly to the accumulators 18, 19, i.e., the input buffers 12, 13 are not used. During a sample interval the first digitized data sample is loaded into the accumulators 18, 19 initially and then compared with subsequent digitized data samples within the sample interval such that at the end of the sample interval the accumulators reflect the maximum/minimum data samples during that sample interval. The min/max data samples are transferred to the output buffers 20, 21 and stored in the next location in the accessed pre-trigger section 27, 28 of the acquisition memory 26'. Once the trigger signal occurs the post-trigger data samples are accumulated in the post-trigger section 30 of the acquisition memory 26', as described above. At the end of the acquisition cycle the locations of the pre-trigger data samples in the appropriate pre-trigger section 27, 28 are now definitively known so that, as the other pre-trigger section 28, 27 is being accessed and filled, the data samples from the prior pre-trigger section 27, 28 are being compared with the corresponding data samples as reference samples from the processed pre-trigger section 29, with the data samples from the pre-trigger section replacing the data samples in the processed pre-trigger section if they "exceed" the max/min values represented by the processed data samples. Thus the MAX/MIN values for the pre-trigger data samples are finally determined after the acquisition cycle during the pre-trigger cycle of the next acquisition cycle. The processed pre-trigger and post-trigger sections 29, 30 form the portion of the acquisition memory 26, that is used to display the analog waveform.

In summary acquisition starts with normal MIN/MAX decimation in the first pre-trigger section 27 in a circular manner. Thus the first pre-trigger section accumulates values for each sample interval. After pre-trigger fill time, i.e., the minimum amount of time required to fill the first pre-trigger section 27 as determined by an operator, a trigger signal occurs and post-trigger accumulation occurs in the post-trigger section 30 as described above. After post-trigger accumulation is completed, hold-off time, if any, is asserted. After hold-off two processes are overlapped. Pre-trigger acquisition of MIN/MAX pairs occurs into the second pre-trigger section 28, and MIN/MAX accumulation occurs between the first pre-trigger section 27 and the processed pre-trigger section 29. This can be done now since the trigger position is known for the data in the first pre-trigger section 27. This process continues, with one pre-trigger section data being accumulated with prior pre-trigger section data while the other pre-trigger section is accumulating data for the next acquisition.

When acquisition is initiated by the operator in the save-on-delta mode, the values loaded into a waveform specification memory, equivalent to the acquisition memory 26, are MAX/MIN limit values that define a template. Any digitized data points that fall outside the template represent an error condition, and subsequent acquisition cycles are terminated so that the current acquisition cycle may be captured for subsequent examination. Once transferred from the acquisition memory 26, the acquisition may then continue. The save-on-delta mode circuitry is then similar to the envelope mode circuitry except that the input multiplexers 14, 15 may be deleted since only the template via the input buffers 12, 13 is loaded into the accumulators 18, 19 at the beginning of each sample interval. Also the output buffers 20, 21 and output multiplexer 22 are not needed since the template is not changed, and thus there is no need to change the data in the memory 26. Further the outputs of the comparators 16, 17 are applied to the error latch 24 rather than to the accumulators 18, 19. If as a result of a comparison there is an out-of-limit condition, the latch 24 is set by the output of the comparator 16, 17 detecting the condition to provide the error signal. The latch 24 is reset at the beginning of each acquisition.

Again operation is similar to that described above with respect to the envelope mode. For post-trigger data the corresponding template values from the memory 26 are loaded via the input buffers 12, 13 into the accumulators 18, 19 for comparison with the digitized samples. When the out-of-limit condition is detected by the comparators 16, 17, the latch 24 is set to generate the error signal. For pre-trigger data the acquired pre-trigger data is compared with the pre-trigger template values stored in the processed/template pre-trigger section 29 of the memory 26' while the next acquisition cycle is acquiring pre-trigger data samples. If an error indication is generated during the pre-trigger processing, then the next acquisition cycle is terminated at the occurrence of the trigger signal, prior to post-trigger data acquisition, so that the resulting stored waveform, including both pre-trigger and post-trigger data samples, may be transferred to main memory to save the portion of the analog signal having an error condition. Once the transfer is complete, then the acquisition is reinitialized and the latch 24 is reset to start acquiring the waveform again.

Thus the present invention provides zero dead time acquisition for a digital storage oscilloscope in a decimation/accumulation mode of operation, using either envelope or save-on-delta modes, by comparing incoming digitized data with values from an acquisition memory that represent either accumulated data for a prior acquisition or a waveform specification, or template.

What is claimed is:

1. An acquisition system of the type that digitizes an analog signal in response to a trigger signal at a first sample rate to produce a stream of digital data samples and provides output samples for storage in an acquisition memory at a decimated sample rate that is an integer submultiple of the first sample rate comprising:
   means for comparing the digital data samples with a limit value for each of a plurality of sample intervals determined by the decimated sample rate and modifying the limit value to equal a current one of the digital data samples or not depending on an outcome of each comparison;
   means for selecting between an initial data sample from the acquisition memory and an initial one of the digital data samples as the limit value during each sample interval, the initial data sample corresponding to the output data sample stored in the acquisition memory for the same sample interval from a prior acquisition cycle; and
   means for providing a final value of the limit value to the acquisition memory as the output data sample for each sample interval.

2. An acquisition system as recited in claim 1 wherein the selecting means comprises:

means for temporarily storing the initial data sample from the acquisition memory prior to each sample interval; and means for multiplexing the initial data sample with the digital data sample to provide the limit value, the initial data sample being provided as the limit value at the start of each sample interval.

3. An acquisition system as recited in claim 1 wherein the providing means comprises:

means for temporarily storing the limit value from the comparing means at the end of each sample interval; and means for transmitting the limit value from the storing means to the acquisition memory as the output data sample for each sample interval.

4. An acquisition system as recited in claim 1 further comprising means for indicating an error condition when the comparing means determines that the digital data samples fall outside the limit value for each sample interval.

5. An acquisition system as recited in claim 4 wherein the indicating means comprises a latch that produces a true output indicating the error condition when the comparing means determines that any one of the digital data samples falls outside the limit value.

6. An acquisition system as recited in claim 1 wherein the comparing means comprises:

a register for storing the limit value from the selecting means; and a comparator for comparing the limit value from the register with the digital data samples to generate an enabling signal when any one of the digital data samples falls outside the limit value, the enabling signal allowing the register to store the one digital data sample as the limit value.

7. An acquisition system of the type that digitizes an analog signal in response to a trigger signal at a first sample rate to produce a stream of digital data samples and provide output samples for storage in an acquisition memory at a decimated sample rate that is an integer sub-multiple of the first sample rate comprising:

means for comparing the digital data samples with a limit value for each of a plurality of sample intervals determined by the decimated sample rate;

means for loading an initial data sample from the acquisition memory as the limit value for each sample interval; and means for indicating an error condition when the comparing means determines that at least one of the digital data samples falls outside the limit value for any one of the sample intervals.

8. A method of acquiring an analog signal using a decimation/accumulation technique over a plurality of acquisition cycles, each acquisition cycle being initiated by a trigger signal, wherein the analog signal is digitized at a first sample rate to produce a stream of digital data samples and stored in an acquisition memory as output data samples at a decimated sample rate that is an integer submultiple of the first sample rate, the digital data samples being accumulated during each sample interval of the acquisition cycle determined by the decimated sample rate to produce decimated samples as the output data samples that are stored in the acquisition memory, comprising the steps of:

loading after the trigger signal one of the output data samples from the acquisition memory for a prior acquisition cycle into an accumulator as a reference sample at the beginning of a current sample interval of a current acquisition cycle, the output data sample loaded being from the sample interval in the acquisition memory corresponding to the current sample interval;

comparing the reference sample with each digital data sample within the current sample interval;

replacing the reference sample with one of the digital data samples when the one digital data sample falls outside a limit defined by the reference sample;

storing at the end of the current sample interval the reference sample from the accumulator into the acquisition memory as the output data sample in place of the output data sample from the prior acquisition cycle; and repeating the above steps for each sample interval of the current acquisition cycle.

9. The method of claim 8 further comprising the steps of:

acquiring prior to the trigger signal digital data samples for storage as output data samples in a first pre-trigger portion of the acquisition memory;

comparing simultaneously with the acquiring step output data samples as reference samples from a processed pre-trigger portion of the acquisition memory with the output data samples from a second pre-trigger portion of the acquisition memory that were acquired prior to the trigger signal of the prior acquisition cycle for corresponding sample intervals; and replacing the reference samples in the processed pre-trigger portion with one of the output data samples when the output data sample falls outside the limit defined by the corresponding reference sample for each sample interval.

10. A method of acquiring an analog signal using a decimation/accumulation technique over a plurality of acquisition cycles, each acquisition cycle being initiated by a trigger signal, wherein the analog signal is digitized at a first sample rate to produce a stream of digital data samples and stored in an acquisition memory as output data samples at a decimated sample rate that is an integer submultiple of the first sample rate, the digital data samples being accumulated during each sample interval of the acquisition cycle determined by the decimated sample rate to produce decimated samples as the output data samples that are stored in the acquisition memory, comprising the steps of:

loading a template sample from a waveform specification memory into an accumulator as a reference sample at the beginning of a current sample interval of a current acquisition cycle, the template sample loaded being for the sample interval corresponding to the current sample interval;

comparing the reference sample with each digital data sample within the current sample interval;

generating an error signal when one of the digital data samples falls outside a limit defined by the reference sample;

repeating the above steps for each sample interval of the current acquisition cycle; and terminating at the end of the current acquisition cycle further acquisition cycles if the error signal is generated during the current acquisition cycle.

11. The method of claim 10 further comprising the steps of:

acquiring prior to the trigger signal digital data samples for storage as output data samples in a first pre-trigger portion of the acquisition memory;

comparing simultaneously with the acquiring step template samples from a processed pre-trigger portion of the waveform specification memory with the output data samples from a second pre-trigger portion of the acquisition memory that were acquired prior to the trigger signal of the prior acquisition cycle for corresponding sample intervals; and generating the error signal when one of the output data samples falls outside the limit defined by the corresponding template sample for each sample interval.

* * * * *